(12) United States Patent
Fornari et al.

(10) Patent No.: US 9,097,841 B2
(45) Date of Patent: Aug. 4, 2015

(54) FRESNEL LENS ARRAY WITH NOVEL LENS ELEMENT PROFILE

(76) Inventors: Luigi Salvatore Fornari, Arlington, TX (US); Margaret Ree Fraelich, Ft. Worth, TX (US)

( * ) Notice: Subject to any disclaimer, the term of this patent is extended or adjusted under 35 U.S.C. 154(b) by 82 days.

(21) Appl. No.: 13/047,768

(22) Filed: Mar. 14, 2011

(65) Prior Publication Data

US 2012/0060920 A1 Mar. 15, 2012

Related U.S. Application Data

(60) Provisional application No. 61/313,254, filed on Mar. 12, 2010.

(51) Int. Cl.
| | |
|---|---|
| *H01L 31/00* | (2006.01) |
| *G02B 3/08* | (2006.01) |
| *B29D 11/00* | (2006.01) |
| *C03B 19/02* | (2006.01) |
| *G02B 19/00* | (2006.01) |
| *H01L 31/054* | (2014.01) |
| *G02B 3/00* | (2006.01) |

(52) U.S. Cl.
CPC ............ *G02B 3/08* (2013.01); *B29D 11/00269* (2013.01); *C03B 19/02* (2013.01); *C03B 19/025* (2013.01); *G02B 19/0014* (2013.01); *G02B 19/0028* (2013.01); *G02B 19/0066* (2013.01); *H01L 31/0543* (2014.12); *G02B 3/005* (2013.01); *G02B 3/0068* (2013.01); *Y02E 10/52* (2013.01)

(58) Field of Classification Search
CPC ................................................ B29D 11/00269
USPC ........... 136/243–265; 359/642–750, 619–625
See application file for complete search history.

(56) References Cited

U.S. PATENT DOCUMENTS

| | | | | |
|---|---|---|---|---|
| 3,991,741 A * | 11/1976 | Northrup et al. | ............... | 126/578 |
| 4,320,246 A * | 3/1982 | Russell | .......................... | 136/248 |
| 4,531,812 A * | 7/1985 | Oguino | .......................... | 359/457 |
| 5,191,479 A * | 3/1993 | Tsuchida | ...................... | 359/742 |
| 5,551,042 A * | 8/1996 | Lea et al. | ...................... | 359/742 |
| 6,399,874 B1 * | 6/2002 | Olah | .............................. | 136/259 |
| 2005/0041307 A1 * | 2/2005 | Barone | .......................... | 359/742 |
| 2008/0204901 A1 * | 8/2008 | Amano et al. | ................ | 359/742 |

* cited by examiner

*Primary Examiner* — Jeffrey T Barton
*Assistant Examiner* — Niki Bakhtiari
(74) *Attorney, Agent, or Firm* — William Lovin & Assoc., LLC

(57) ABSTRACT

A Fresnel lens array is provided in which the vertical part of a lens element is replaced by a tilted surface designed to focus impinging light into the focal point of an adjacent lens in the array. Since the new surface forms an angle with the lens plane that is shallower than the vertical step, such a lens element configuration may ease the molding of the lens array in glass type materials. The configuration is not limited to cylindrical arrays, since another array with lens elements perpendicular to the first lens array may be molded on the other side of the lens sheet, resulting in an array of point focusing lenses. Furthermore, by placing mirrors at the edges of the lens array (or at the edge of a single lens thereof) with surfaces perpendicular to the lens plane, the edge light rays may be redirected back to the said focal point(s). In particular, single circular lenses, with lens element cross-sections similar to the one described above and with a vertical mirror at the edge, will also concentrate collimated light to the focal point.

17 Claims, 8 Drawing Sheets

FRESNEL LENS ARRAY WITH NOVEL LENS ELEMENT PROFILE

CROSS-REFERENCE TO RELATED APPLICATIONS

The present application claims priority to U.S. Ser. No. 61/313,254 (Fornari et al.), which was filed on Mar. 12, 2010, and which is incorporated herein by reference in its entirety.

FIELD OF THE DISCLOSURE

The present disclosure relates generally to Fresnel lenses, and more particularly to Fresnel lenses having novel lens element profiles that provide improved throughput and permit their manufacture out of glass with reduced optical distortion.

BACKGROUND OF THE DISCLOSURE

Fresnel lenses and Fresnel lens arrays have been used for decades with various configurations of lens element and surface geometries, and in planar or three-dimensional arrangements. These lenses have been utilized in various applications, including their use as solar collectors and as collimators for light sources. In all of these applications, the lenses are preferably constructed from plastic materials, since these materials permit the easy fabrication of a lens element profile with sharp groove tips and deep roots. Although the original implementation of these lenses by Augustine Fresnel was in hand-ground glass for use in lighthouses, such an implementation has been neglected due to the high cost of grinding the materials to the correct shapes.

SUMMARY OF THE DISCLOSURE

Figure 1:
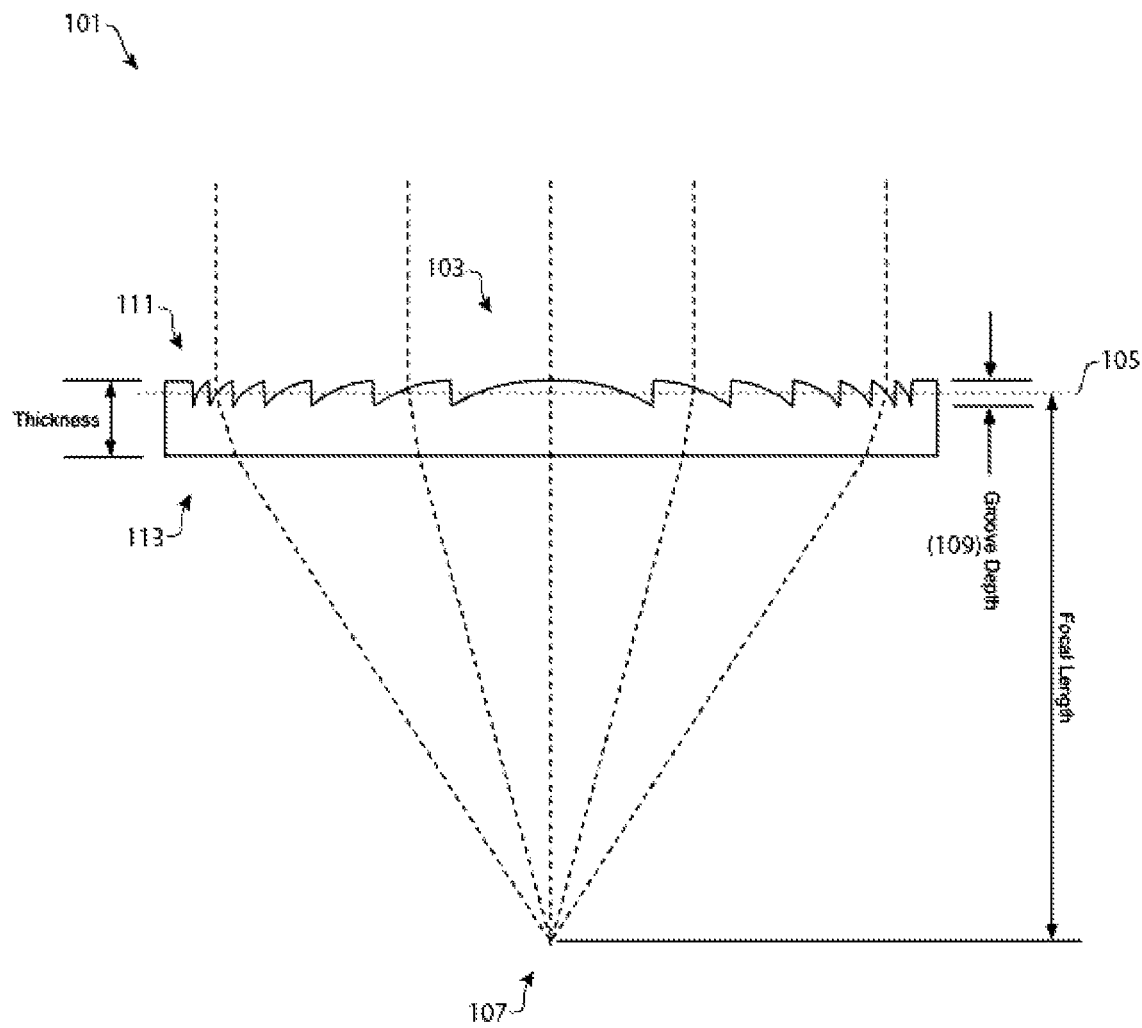
FIG. 1 is a profile of a state of the art "Grooves Out" Fresnel Lens.

In one aspect, a Fresnel lens or a Fresnel lens array is provided which comprises a plurality of lens elements, wherein each of said plurality of lens elements has a profile, in a plane containing the optical axis of the lens, which contains first and second distinct adjoining arcuate portions.

In another aspect, a Fresnel lens or a Fresnel lens array, comprising a plurality of lens elements, wherein each of said plurality of lens elements has a rounded profile.

In a further aspect, a method for making a Fresnel lens or a Fresnel lens array. The method comprises (a) providing a mold having a pattern defined on a first surface thereof, wherein said pattern comprises a series of features, and wherein each feature has a profile, in a plane normal to the first surface, which contains first and second distinct adjoining arcuate portions; (b) molding a portion of molten glass with the mold; and (c) cooling the molded glass.

In yet another aspect, a lens assembly is provided which comprises a first Fresnel lens comprising a first plurality of lens elements, wherein each of said first plurality of lens elements has a profile, in a plane containing the optical axis of the lens, which includes first and second distinct adjoining portions, and wherein each of the first and second portions of each of said first plurality of lens elements focuses incident light on either the focal point of the first Fresnel lens or on the focal point of another Fresnel lens.

DETAILED DESCRIPTION

Recent advances in technology have made the precision molding of glass feasible. Glass is often the material of choice for the fabrication of optical components in applications such as solar energy concentrators, high temperature collimators, and the like, due to its extended operating temperature range, resistance to abrasion, and low cost. However, the production of Fresnel lens profiles in glass remains a challenge, due to the difficulty in faithfully reproducing the sharp features of the lens elements required by such profiles. These difficulties arise from the physical properties of glass.

In particular, glass has a high surface tension when it is in a molten state, and undergoes considerable dimensional change as it cools and changes from a viscous moldable phase into a solid phase. During this cooling process, undesired changes in the shape of the molded profile typically occur. For example, the tips and the roots of the lens element profiles in the Fresnel lens (that is, the apex of the grooves and the points at which the edges of the grooves intersect with the surface of the lens) tend to become rounded, thereby altering the path of the light through the resulting lens. At sufficiently high lens element densities, most of the incident light will fail to reach the focus, thus resulting in a significant loss of throughput for an optical system which incorporates such a lens.

It has now been found that the foregoing problems may be overcome through the provision of a lens element geometry, in the profile of a Fresnel lens, that reduces the sharpness of the tip and root angles. Such a geometry allows for the faithful reproduction of the desired profile in glass. Fresnel lenses having this geometry are especially suitable for solar collectors, where they may be utilized to focus solar radiation on the optoelectronic surfaces of photovoltaic modules.

There are many ways to design a Fresnel lens. Preferably, the object distance from the first surface of the lens and the image distance from its other surface are defined first, after which the lens elements (including the associated groove depths) and the shape of the surfaces (for example, planar or spherical) are established. Commercial ray tracing programs, such as ZEMAX®, CODE V®, ASAP® or FRED®, may be used to optimize the aspheric surfaces and the Fresnel grooves to solve the particular optical problem of interest.

Without loss of generality, the following discussion will be limited to the specific case of a constant groove depth plano-convex lens with conjugates of focal length and infinity. The "Grooves Out" (GO) case will be defined as the one in which the collimated beam from the infinite conjugate first strikes the grooved surface (see, e.g., FIG. 1), and the "Grooves In" (GI) case will be defined as the one in which the collimated beam first strikes the planar surface (see, e.g., FIG. 2).

Figure 2:
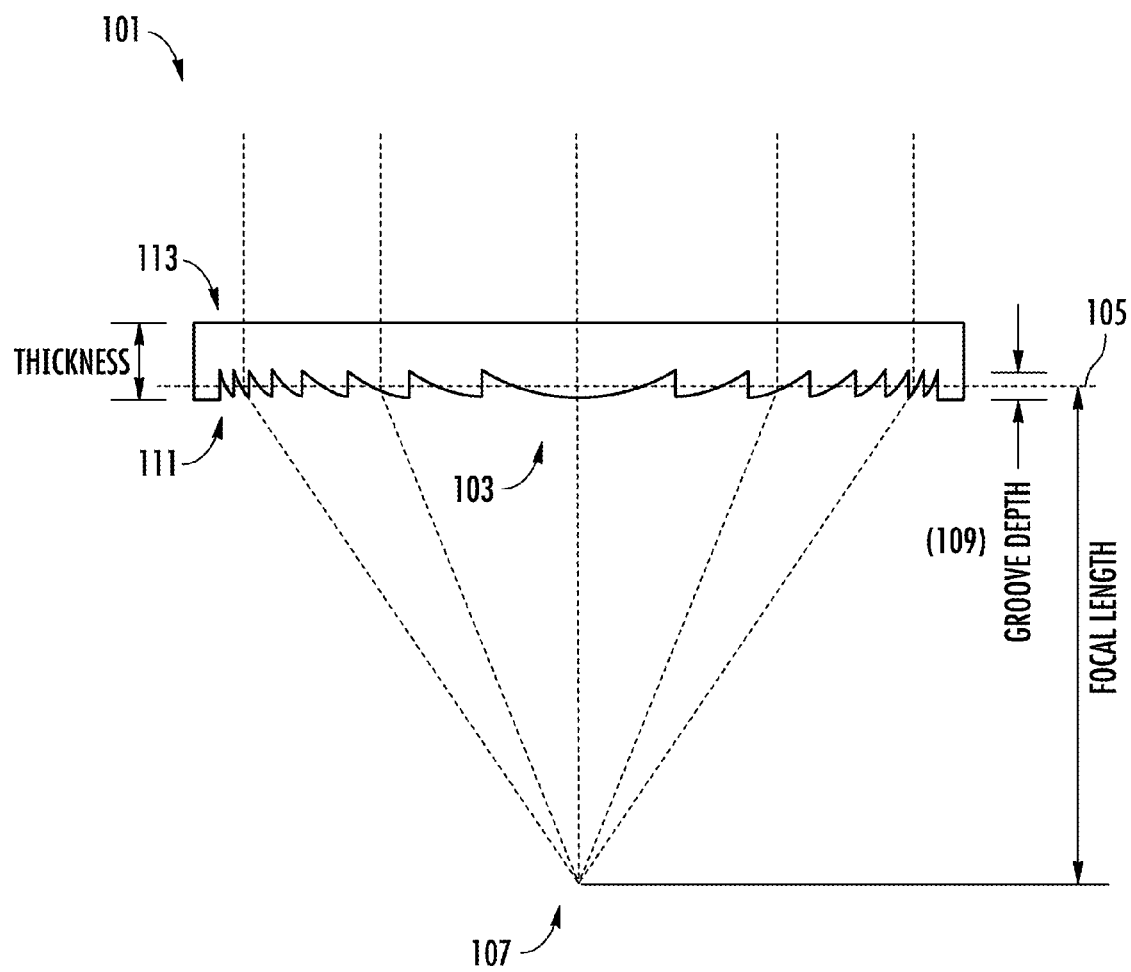
FIG. 2 is a profile of a state of the art "Grooves In" Fresnel Lens.

The lens arrays described herein may be further understood by first considering the Fresnel lenses 101 depicted in FIGS. 1-2. Starting with the surface point on the optical axis, the groove is approximated by a succession of segments 103 of arbitrary small length, whose tilt with respect to the lens plane 105 is calculated by applying Snell's Law so that a collimated ray passing through the segment center ends on the focal point

107. When the sag—that is, the distance of the segment's center point from the reference surface passing through the vertex of the lens—exceeds the groove depth 109, then that point is defined as a root point. The next point, defined as a tip point, is placed on the reference plane, at the same distance from the optical axis as the previous root point. From there, the calculation of the points is repeated, with further roots and tips defined until the desired diameter is reached. The algorithm just described is just one of the many that can be used to generate such a lens in accordance with the teachings herein. No attempt has been made to emulate a spherical surface.

There are two main differences in the calculations for the GO and the GI cases. For the GI case, the ray first enters the flat surface 111 without deviation, and is deflected toward the focal point 107 solely by the tilt of the groove. Since the ray goes from a medium with an index of refraction of higher value than that of air, the angle of the groove cannot exceed the angle of total internal reflection for the medium, ArcSin (1/n). For a lens (in air) made of acrylic material with an index of 1.49, this angle is 42.2°. When the groove is at the critical angle, the focal point 107 cannot be nearer to the lens apex than the intercept of the segment line with the optical axis, thus limiting the GI type lenses to a minimum f-number (f/#). For such an acrylic lens, the limit is f/#=0.453.

In the case of GO type lenses, both the grooved surface 113 and the flat surface 111 contribute to the bending of the incident ray, somewhat complicating the calculations. However, since the ray may exit parallel to the flat side 111, there is no limit on the lens size unless the focal point lies within the material. The tilt of the groove's segment 103 increases until it causes the ray to be deflected at an angle equal to the total internal reflection of the flat side (back surface) 111 and emerges parallel to the back of the lens 101. From then on, the grooves have the same tilt, and the rays superimpose each other.

Figure 3:
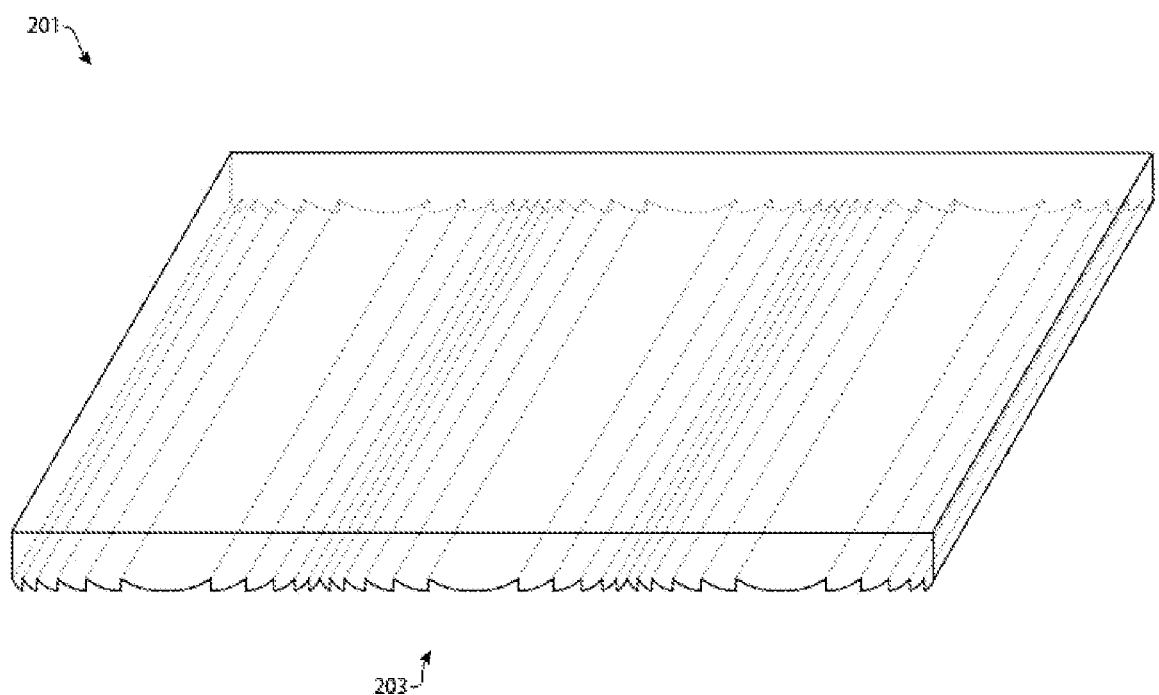
FIG. 3 is an example of a cylindrical Fresnel lens array.
Figure 4:
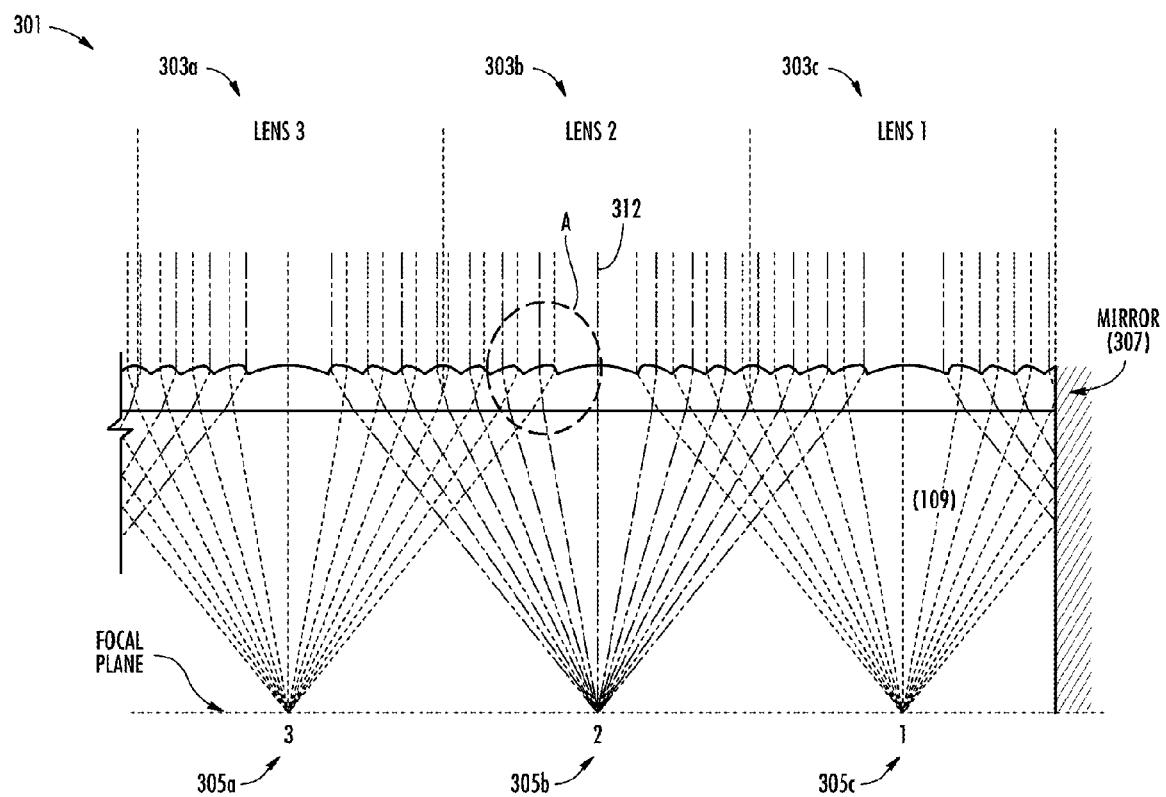
FIG. 4 is an arrangement of lens elements having profiles in accordance with the teachings herein.

FIG. 3 shows a cylindrical lens array 201 made of GI lenses 203 using the traditional groove configuration, while FIG. 4 shows a particular, non-limiting embodiment of a GO lens array 301 in accordance with the teachings herein. The lens array 301 of FIG. 4 is similar to the lens array 201 of FIG. 3. In particular, the center-to-center spacing between the lenses 303 of the lens array 301 of FIG. 4 is the same as the lens array 201 of FIG. 3, and the focal length (corresponding to focal points 305) of the lenses 303 in the two lens arrays is also the same. However, the profile of the lens elements (see FIG. 8) of each individual lens 303 in the lens array 301 of FIG. 4 is modified (in comparison with the profile of the corresponding segment 203 in the lens array 201 of FIG. 3) as described below.

Figure 8:
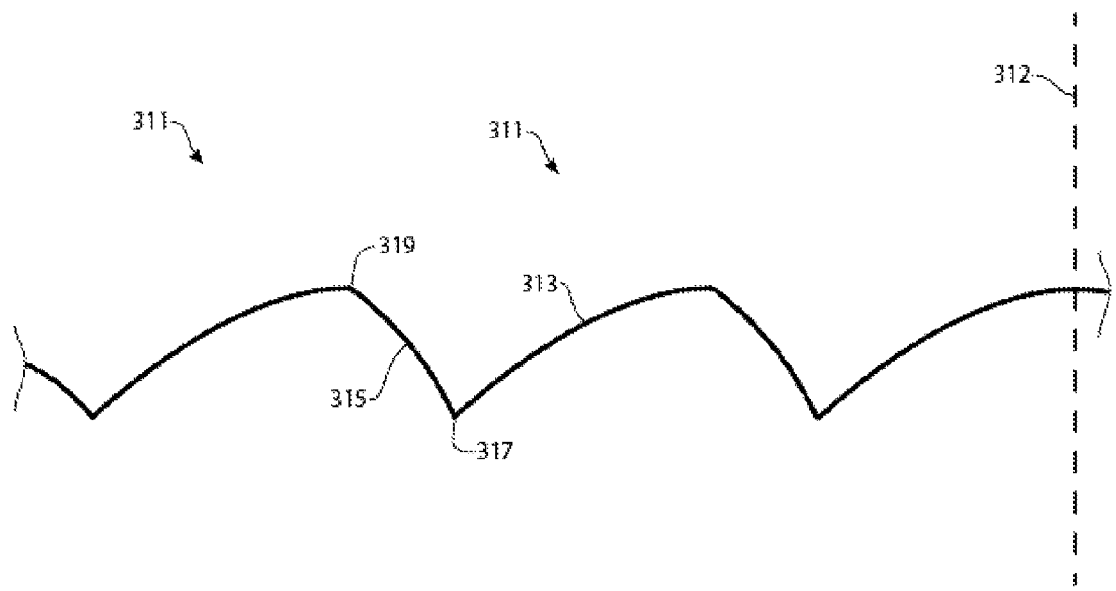
FIG. 8 is a magnified view of REGION A of FIG. 4.

As illustrated in FIG. 8 for REGION 8 of FIG. 4, starting from the optical axis at 312, the grooves of the new configuration are calculated as for the standard GO case until the first root 317 is reached. The resulting lens element 313 directs the ray towards the focal point 305*b* of the lens 303*b*. The calculation is then repeated, starting from the root 317; however, instead of stepping straight to the tip 319, a second lens element 315 is defined which aims the ray toward the focal point 305*a* of adjacent lens 303*a*. The iteration process is continued until the lens apex plane is reached at 319. The aim of the ray is returned to the focal point 305*b* of the lens 303*b*, and the series of calculations is repeated, switching the focal point 305 back and forth between 305*a* and 305*b* until the middle point between the two lens centers is reached.

It is clear by symmetry that the rest of the lens 303 is the mirror image of what has been just calculated. Therefore, the only two variables in the geometry are the lens spacing and the focal length, or equivalently the f/# of the lenses of the array 301. It may be desirable that, for each value of the f/#, the thickness of the grooves is tuned so that the point common to the two lenses is a tip point with a tangent that is as parallel to the lens plane as possible.

It is straight forward to calculate the angles that the ascending and descending part of the grooves make with the lens plane. As expected, the angles decrease with increasing f/#, and the positive angles (the ascending part of the grooves) are larger in absolute value than the negative angles (the descending part of the grooves). This is because the ascending values correspond to the part of the lens 303 that is further away from the optical axis. It is also straight forward to calculate the angle values as a function of the groove depth.

Thus far, the discussion has been concerned primarily with arrays of cylindrical lenses. Losses, which may be acceptable for some applications, typically occur at both ends of an array 301, since a portion of the grooves in the last lens 303 will deflect the light outside of the perimeter of the array 301. However, this problem may be solved by placing a vertical mirror 307 on the sides of the lens array 301, as shown in FIG. 4. The mirror 307 will reflect the rays going out of the border, redirecting them towards the last focal point 307, just as produced by a virtual lens outside of the border.

Figure 5:
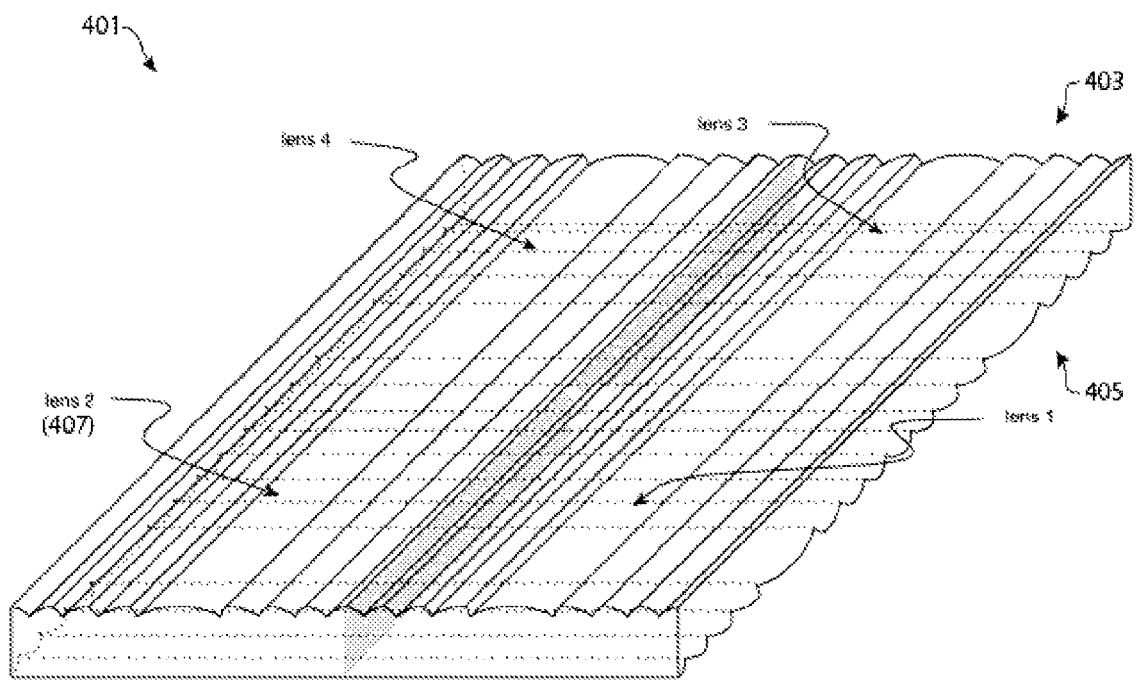
FIG. 5 is an implementation of a circular lens array using two cylindrical lens arrays which are crossed.
Figure 6:
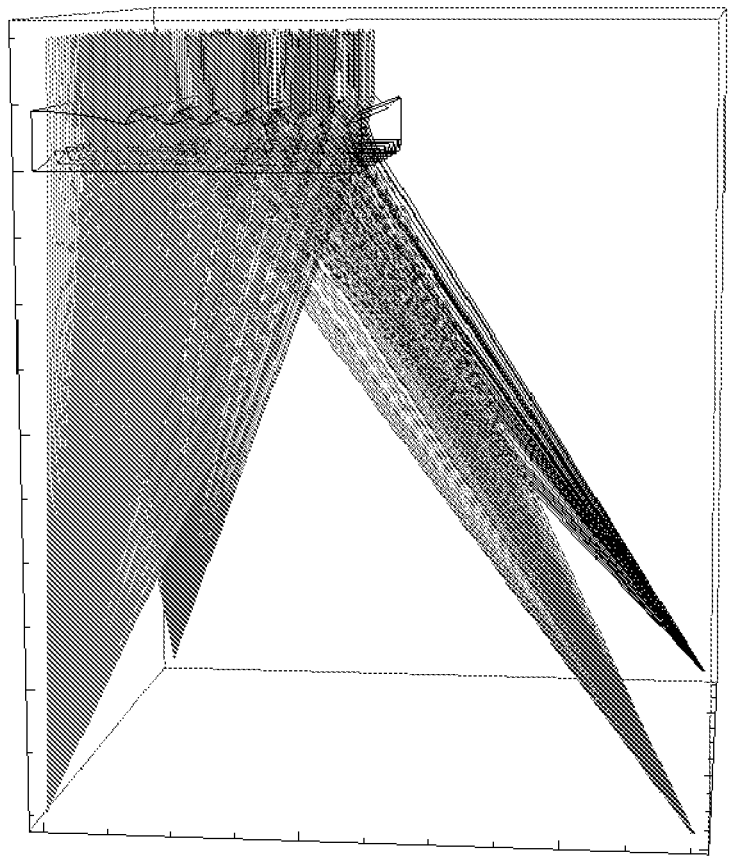
FIG. 6 is a ray tracing of one quadrant of the array.

FIG. 5 shows a particular, non-limiting embodiment of an optical device 401 made in accordance with the teachings herein which features the superposition of two lens arrays 403, 405. A ray tracing of one quadrant of the optical element is shown in FIG. 6. The first lens array 403 is a GI array on the side of the material toward the focal plane, and the second lens array 405 is a GO array on the side of the material away from the focal plane. The optical axes of the two lens arrays 403, 405 are perpendicular to each other and have proper focal lengths so that a single point image is produced. A further feature of this optical device 401 is that a collimated beam aimed onto each single combined lens 407 of the optical device 401, when slightly out of focus, will produce a square spot (or rectangular, depending on the relative GO/GI f/# ratio).

Figure 7:
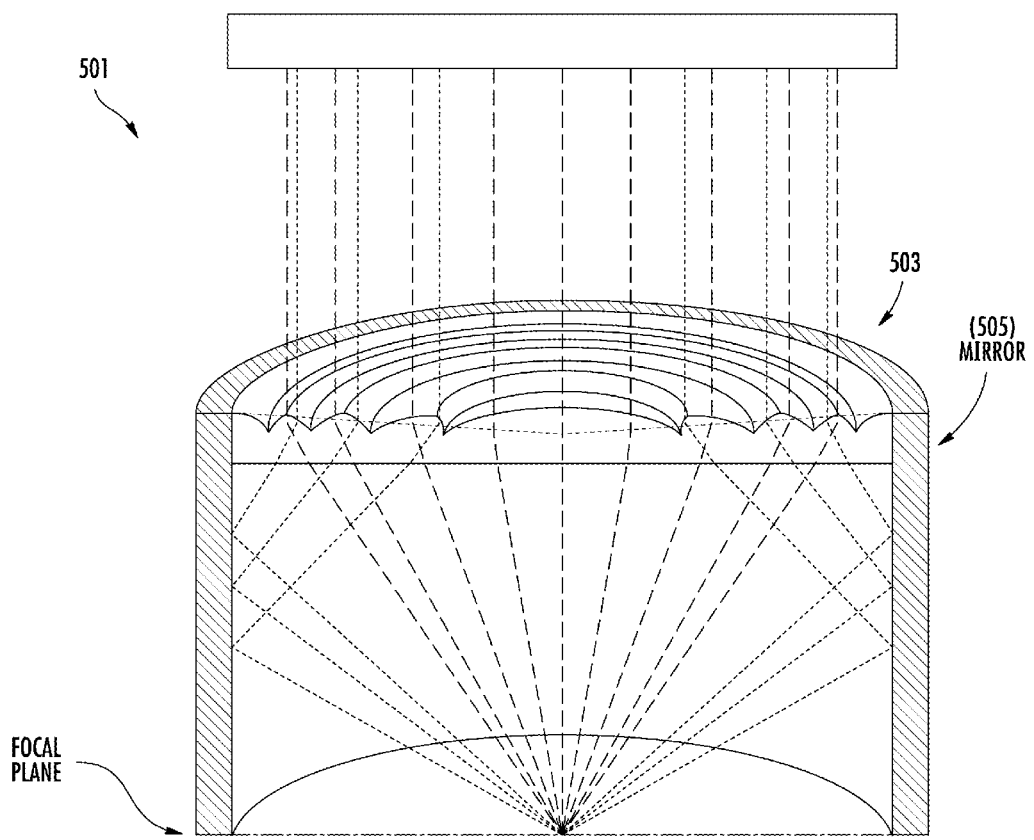
FIG. 7 is an example of a single circular lens implemented with the new lens element arrangement and a side mirror.

FIG. 7 shows a particular, non-limiting embodiment of a circular optical element 501 made in accordance with the teachings herein. The optical device 501 features a combined single lens 503 with side mirrors 505 for single focus applications. In most other respects, however, the optical device 501 operates in a similar manner to the lens array 301 of FIG. 4.

As previously noted, the Fresnel lenses and lens arrays described herein are especially suitable for use in solar collectors, where they may be used to focus light on one or more photovoltaic cells or photovoltaic cell arrays. In such an application, the optoelectronic surface of the photovoltaic cell or photovoltaic cell array will typically be disposed in the focal plane of one or more of the Fresnel lens or lens arrays so that collected solar radiation is focused on this surface.

Various glasses may be used in the devices and methodologies described herein. These include, without limitation, glasses of the "soda-lime" type which contain silicon dioxide (silica), $Na_2O$ (soda), and CaO (lime); flint glasses, which are high-density, high-dispersion, high-refractive-index glasses that typically contain 45-65% lead oxide or, in some cases, other heavy elements such as lanthanum and rare earth elements; and barium glasses, which contain barium oxide rather than lead oxide, and which have refractive indices comparable to those of flint glasses, but have lower dispersions.

In some embodiments, other glass forming materials may be utilized in place of, or in combination with, common silica-based glasses. Such materials may include boron oxide ($B_2O_5$), phosphorus pentoxide ($P_2O_5$), germanium oxide (GeO$_2$), and various other inorganic and organic materials which form glasses, including plastics (e.g., acrylic glass), carbon, metals, phosphates, borates, chalcogenides, fluorides, germanates (glasses based on GeO$_2$), tellurites (glasses based on TeO$_2$), antimonates (glasses based on Sb$_2$O$_3$), arsenates (glasses based on As$_2$O$_3$), titanates (glasses based on TiO$_2$), tantalates (glasses based on Ta$_2$O$_5$), nitrates, carbonates, fluoride glasses (fluorozirconates, fluoroaluminates), aluminosilicates, phosphate glasses, and various other substances.

While the methodologies described herein are especially useful for making Fresnel lens arrays which may or may not have concentric grooves, one skilled in the art will appreciate that the methodologies described herein may be used to produce a variety of different lens patterns and lens arrays, and are not limited to the production of Fresnel lenses. Moreover, these methodologies may also be utilized to produce individual lenses.

Various profiles may be used in the lens arrays described herein. Preferably, for the reasons noted above, these profiles are rounded or concave outward. The profiles may contain or consist of two arcuate sections. In some embodiments, the first arcuate portion is defined by a second order polynomial $f_1(x)=a_0+a_1x+a_2x^2$, wherein $a_0$, $a_1$, $a_2 \in R$, and wherein $a_2 \neq 0$, and/or the second arcuate portion is defined by a second order polynomial $f_2(x)=b_0+b_1x+b_2x^2$, wherein $b_0$, $b_1$, $b_2 \in R$, and wherein $b_2 \neq 0$. Of course, it follows from the foregoing that, in some embodiments, the entire lens profile and/or each arcuate portion may be defined by a second or higher order polynomial or mathematical function.

One skilled in the art will appreciate that the lens arrays disclosed herein, which enable the production of Fresnel lens arrays in glass or similar materials, may extend the use of Fresnel lens arrays in applications where an extended temperature range is desired. Furthermore, the lens arrays disclosed herein may greatly extend the life of concentration type solar photovoltaic collectors due to the scratch resistant nature of the glass. Moreover, although the surface exposed to the weather is not flat, the relatively open groove/tip configuration will allow for easy cleaning, especially when the outside grooves are oriented along the meridian.

The lenses described herein have a variety of end uses, and may be incorporated into various devices. For example, these lenses may be utilized in photovoltaic modules, and luminaires (especially those which utilize LED light sources).

As noted above, glass is the preferred material for use in the devices and methodologies described herein. However, these devices and methodologies are not limited to the use of glass. For example, elements of lenses made in accordance with the teachings herein may be made from various plastics and composite materials. The refractive index of a material and its adsorption characteristics over the spectral region of interest will typically be significant factors in determining its suitability for use in that region.

In some embodiments of the lenses described herein, filled polymers may be used in the construction of the lens. Thus, for example, polymers as a matrix or continuous phase, and materials such as zinc selenide, germanium, or combinations of these or other suitable materials as a disperse phase.

The lenses disclosed herein, and the imaging devices which may incorporate them, may contain various other elements and features. Thus, for example, each optical element may be provided with one or more antireflective layers. The elements and other components may also be treated or coated with materials that impart scratch-resistance or anti-soiling properties to these elements. The lenses may further be provided with polarizing elements.

The lens elements disclosed herein may also be treated with various dyes, pigments or tints which may be employed, for example, to selectively absorb certain wavelengths of light or to give the lens elements a desired color. These dyes, pigments or tints may be applied homogeneously throughout the material used to make the lens elements, or may be selectively applied to particular surfaces or features of the lens elements.

The devices which may incorporate the lenses described herein may also be provided with one or more mirrors, reflective surfaces, or other reflective elements. In some embodiments, these reflective elements may be used to alter the orientation or sequence of the lens elements within the optical path. Such reflective elements may also be used where necessary to deploy a given lens within the body of a given device or to adapt the lens to a given design framework or chassis. Moreover, while the preferred embodiment of the lenses and imaging devices described herein employ only two lens elements, it will be appreciated that the principles set forth herein could also be applied to lenses and devices which employ a greater number of elements.

Devices may also be designed in accordance with the teachings herein which contain more than one lens. In such a case, the two lenses may be constructed from different materials and may have Fresnel surfaces with different designs, and a means may be provided to alter or direct the optical path between the two lens or to selectively move the lenses into or out of the optical path.

Preferably, the grooves in the lenses disclosed herein all extend to the same depth and have surfaces that are fully aspheric. However, various lenses and imaging devices may also be produced in accordance with the teachings herein in which the grooves extend to different depths, or in which the surfaces of the grooves have other desired shapes or profiles. Thus, for example, the grooves may be of substantially constant width or depth or a combination of the two, and may be conical, spherical, toroidal, or fully aspheric in cross-section, or may have a cross-sectional shape which is a combination of the aforementioned shapes.

The details of the Fresnel surfaces in the lenses and devices described herein may also be varied in accordance with the intended end use of the lens or device. Thus, for example, the depths of the typically concentric grooves of the Fresnel surface may be constant as noted above, or may be varied randomly or in accordance with some algorithm or formula. Also, the grooves may have various angular offsets, which will typically be selected to optimize the desired optical properties of the lens. Moreover, the design of the Fresnel surface may vary from one portion of the surface to another. For example, the surface may contain catadioptric and dioptric grooves and a bull's eye lens which are all independently designed.

The lenses, and the components thereof, which are described herein may be fabricated through various methodologies. The lens elements of these lenses may be injection molded, but could also be fabricated, in whole or part, through compression molding, injection compression molding (also called coining), cell casting, continuous casting, high precision molding, discrete embossing, continuous embossing, and diamond machining.

The Fresnel lenses and lens elements thereof which are described herein may be designed with various focal lengths, both for the lens elements themselves and for the lens as a whole.

Various drive mechanisms may be used in the devices described herein for adjusting the distance between the lens elements or for adjusting the orientation of one or both lens elements. These drive mechanisms may be operated manually and/or automatically, and may be under the control of a microprocessor or other such device. Moreover, these drive mechanisms may operate on only one of the lens elements (i.e., the other lens element or elements may be stationary), or may operate on multiple lens elements in a consecutive or simultaneous fashion.

If the drive mechanism operates on multiple lens elements simultaneously, it need not move each lens element at the same speed or in the same manner. For example, in some embodiments, the drive mechanism may be programmed or adapted to move one of the lens elements at some fraction of the speed that it moves another lens element. The drive mechanism may also be adapted to maintain a fixed orientation or distance between two or more lens elements along one or more axes, while changing the relative orientation or distance between the lens elements along another axis.

The devices disclosed herein are not particularly limited to any particular choice of drive mechanism. For example, the drive mechanism may employ a screw drive, a cable system, a belt, or combinations of these devices.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A lens assembly comprising:
a first Fresnel lens comprising a first plurality of circular concentric lens elements, wherein each of said first plurality of circular concentric lens elements has a profile in a plane containing the center point of the lens elements and perpendicular to the plane of the lens elements which includes first and second distinct adjoining portions, wherein either the first or second distinct adjoining portion of each of said first plurality of circular concentric lens elements focuses incident light to one of at least two regions wherein the first portions of the lens elements belong to a first set of lens features and the second portions of the lens elements belong to a second set of lens features wherein the first set of lens features focus light towards a focal point at the optical center of the first Fresnel lens and the second set of lens features focus light radially disposed around the optical center of said first Fresnel lens such that the radially disposed light may be reflected to the focal point at the optical center of the first Fresnel lens by means of an edge mirror.

2. A lens assembly comprising:
a. a first Fresnel lens comprising a first plurality of converging lens elements, wherein each of said first plurality of lens elements has a profile, in a plane containing the optical axis of said first Fresnel lens, which includes first and second distinct adjoining portions, wherein each of the first and second distinct adjoining portions of each of said first plurality of lens elements focuses incident light on either the focal point of said first Fresnel lens or on the focal point of another Fresnel lens in the plane of said first Fresnel lens; and
b. a second Fresnel lens comprising a second plurality of converging lens elements, wherein each of said second plurality of lens elements has a profile, in a plane containing the optical axis of said second Fresnel lens, which includes first and second distinct adjoining portions, wherein each of the first and second distinct adjoining portions of each of said second plurality of lens elements focuses incident light on either the focal point of said second Fresnel lens or on the focal point of another Fresnel lens in the plane of said second Fresnel lens and wherein said second Fresnel lens is superposed over said first Fresnel lens on a different plane parallel to and above the plane of said first Fresnel lens.

3. The lens assembly of claim 2, wherein the first and second Fresnel lenses have first and second respective mirror planes of symmetry, and wherein said first and second mirror planes of symmetry are parallel.

4. The lens assembly of claim 2, wherein the first and second Fresnel lenses have first and second respective mirror planes of symmetry, and wherein said first and second mirror planes of symmetry are orthogonal.

5. A device comprising the lens assembly of claim 1, wherein said lens assembly contains a single Fresnel lens and is equipped with an edge mirror wherein the second set of lens features focuses light to a focal point at the optical center of the first Fresnel lens by way of said mirror.

6. A device comprising the lens assembly of claim 5, in optical communication with a photovoltaic device.

7. The device of claim 6, wherein the device is a solar cell.

8. The lens assembly of claim 1, wherein the first plurality of concentric lens elements comprises glass.

9. The lens assembly of claim 1, wherein said first and second distinct adjoining portions of each of said first plurality of concentric lens elements have a profile that is concave outward along the optical axis of the lens in the direction going from the focal side of the lens to the object side of the lens.

10. The lens assembly of claim 1, wherein said first and second distinct adjoining portions of each of said first plurality of concentric lens elements have a profile that is concave outward in the direction of the object side of the first Fresnel lens.

11. The lens assembly of claim 1, wherein said first and second distinct adjoining portions of each of said first plurality of concentric lens elements have a profile that is concave or convex outward in the direction of the object side of the lens.

12. The lens assembly of claim 1, wherein said lens has a first smooth surface and a second surface in which said first plurality of concentric lens elements are defined.

13. The lens assembly of claim 12, wherein said first and second distinct adjoining portions of said first plurality of concentric lens elements are concave outward from said second surface.

14. A device comprising the lens assembly of claim 5, in optical communication with a source of light.

15. The device of claim 14, wherein the device is a luminaire.

16. A device comprising the lens assembly of claim 2, in optical communication with at least one source of light.

17. The device of claim 16, wherein the device is a luminaire.

* * * * *